US012562749B2

(12) United States Patent
Roh et al.

(10) Patent No.: US 12,562,749 B2
(45) Date of Patent: Feb. 24, 2026

(54) SAMPLING CIRCUIT AND OPERATING METHOD OF THE SAME

(71) Applicant: SAMSUNG ELECTRONICS CO., LTD., Suwon-si (KR)

(72) Inventors: Hyungdong Roh, Suwon-si (KR); Dasom Park, Suwon-si (KR); Michael Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 141 days.

(21) Appl. No.: 18/635,791

(22) Filed: Apr. 15, 2024

(65) Prior Publication Data

US 2025/0038759 A1 Jan. 30, 2025

(30) Foreign Application Priority Data

Jul. 12, 2023 (KR) ......................... 10-2023-0090671
Sep. 7, 2023 (KR) ......................... 10-2023-0119280

(51) Int. Cl.
*H03M 1/00* (2006.01)
*H03M 1/06* (2006.01)
(Continued)

(52) U.S. Cl.
CPC ....... *H03M 1/1255* (2013.01); *H03M 1/0612* (2013.01); *H03M 1/403* (2013.01)

(58) Field of Classification Search
CPC .. H03M 1/1255; H03M 1/403; H03M 1/1033; H03M 1/0612; H03M 3/496
(Continued)

(56) References Cited

U.S. PATENT DOCUMENTS 5,703,589 A * 12/1997 Kalthoff .................. H03M 3/34
341/172
6,204,787 B1 * 3/2001 Baird .................... H03M 3/488
341/139
(Continued)

FOREIGN PATENT DOCUMENTS

CN 111756379 A 10/2020
CN 113746483 A 12/2021
(Continued)

OTHER PUBLICATIONS

Kaushik Roy et al., "Leakage Current Mechanisms and Leakage Reduction Techniques in Deep-Submicrometer CMOS Circuits", Proceedings of the IEEE, vol. 91, No. 2, Feb. 2003, pp. 305-327, DOI: 10.1109/JPROC.2002.808156.
(Continued)

*Primary Examiner* — Peguy Jean Pierre
(74) *Attorney, Agent, or Firm* — Sughrue Mion, PLLC

(57) ABSTRACT

A sampling circuit includes a linearization circuit connected to a first input terminal for receiving a first input signal and a second input terminal for receiving a second input signal, a first switch connected between the first input terminal and the linearization circuit, a second switch connected between the first input terminal and the linearization circuit, a third switch connected between the second input terminal and the linearization circuit, a fourth switch connected between the second input terminal and the linearization circuit, a first capacitor connected between the linearization circuit and a first output terminal for outputting a first sampled signal, and a second capacitor connected between the linearization circuit and a second output terminal for outputting a second sampled signal.

20 Claims, 20 Drawing Sheets

(51) Int. Cl.
   *H03M 1/12*          (2006.01)
   *H03M 1/40*          (2006.01)
(58) Field of Classification Search
   USPC ................................. 341/155, 120, 122, 118
   See application file for complete search history.

(56)                    References Cited

U.S. PATENT DOCUMENTS

| | | | |
|---|---|---|---|
| 6,956,514 B1 | 10/2005 | Melanson et al. | |
| 8,049,555 B2 | 11/2011 | Arnold et al. | |
| 8,368,453 B2 | 2/2013 | Company Bosch et al. | |
| 2025/0141460 A1* | 5/2025 | Kandimalla ............ | H03M 1/12 |

FOREIGN PATENT DOCUMENTS

| | | |
|---|---|---|
| JP | 2000-132989 A | 5/2000 |
| JP | 2009-27281 A | 2/2009 |
| JP | 2015-159513 A | 9/2015 |

OTHER PUBLICATIONS

Communication dated Dec. 12, 2024, issued by European Patent Office in European Patent Application No. 24180268.5.

\* cited by examiner

E – F – G path + H path

SAMPLING CIRCUIT AND OPERATING METHOD OF THE SAME

CROSS-REFERENCE TO RELATED APPLICATIONS

This application is based on and claims priority under 35 U.S.C. § 119 to Korean Patent Application No. 10-2023-0090671, filed on Jul. 12, 2023, and to Korean Application No. 10-2023-0119280, filed on Sep. 7, 2023, in the Korean Intellectual Property Office, the disclosures of each of which being incorporated by reference herein in their entireties.

BACKGROUND

Apparatuses and devices consistent with the present disclosure relate to a sampling circuit, and more particularly, to a sampling circuit included in an analog-to-digital converter and an operating method of the sampling circuit.

Analog-to-digital converters may be used in a variety of applications, and, in particular, an analog-to-digital converter used in high-speed communication, a signal analyzer, etc. may have a high sampling rate. However, as the sampling speed increases, the analog-to-digital converter becomes more affected by a process, a temperature and a voltage.

SUMMARY

It is an aspect to provide a linearization circuit that improves the linearity between an input and an output of a sampling circuit and a method of operating the same.

According to an aspect of one or more embodiments, there is provided a sampling circuit comprising a linearization circuit connected to a first input terminal for receiving a first input signal and a second input terminal for receiving a second input signal; a first switch connected between the first input terminal and the linearization circuit; a second switch connected between the first input terminal and the linearization circuit; a third switch connected between the second input terminal and the linearization circuit; a fourth switch connected between the second input terminal and the linearization circuit; a first capacitor connected between the linearization circuit and a first output terminal for outputting a first sampled signal; and a second capacitor connected between the linearization circuit and a second output terminal for outputting a second sampled signal.

According to another aspect of one or more embodiments, there is provided an analog-to-digital converter comprising a sampling circuit configured to receive an input signal, which is an analog signal, and output a sampled signal at regular time intervals; a front-end circuit configured to receive the sampled signal, process the sampled signal, and output a processed signal; and a back-end circuit configured to receive the processed signal and convert the processed signal to an output signal, which is a digital signal, and output the digital signal. The input signal comprises a first input signal and a second input signal. The sampling circuit comprises a linearization circuit connected to a first input terminal for receiving the first input signal and a second input terminal for receiving the second input signal; a first switch connected between the first input terminal and the linearization circuit; a second switch connected between the first input terminal and the linearization circuit; a third switch connected between the second input terminal and the linearization circuit; a fourth switch connected between the second input terminal and the linearization circuit; a first capacitor connected between the linearization circuit and a first output terminal for outputting a first sampled signal; and a second capacitor connected between the linearization circuit and a second output terminal for outputting a second sampled signal.

According to yet another aspect of one or more embodiments, there is provided a receiver comprising a sampling circuit configured to receive an input signal, which is an analog signal, and output a sampled signal at regular time intervals. The sampling circuit comprises a linearization circuit connected to a first input terminal for receiving a first input signal and a second input terminal for receiving a second input signal; a first switch connected between the first input terminal and the linearization circuit; a second switch connected between the first input terminal and the linearization circuit; a third switch connected between the second input terminal and the linearization circuit; a fourth switch connected between the second input terminal and the linearization circuit; a first capacitor connected between the linearization circuit and a first output terminal for outputting a first sampled signal; and a second capacitor connected between the linearization circuit and a second output terminal for outputting a second sampled signal.

BRIEF DESCRIPTION OF THE DRAWINGS

Various embodiments will be more clearly understood from the following detailed description taken in conjunction with the accompanying drawings, in which:

FIG. 6C shows an equivalent circuit of a first phase sampling circuit, according to an embodiment;

FIG. 6F is a diagram for describing an equivalent circuit of a first phase sampling circuit, according to an embodiment;

DETAILED DESCRIPTION

To achieve a high sampling rate in an analog-to-digital converter, a time-interleaved analog-to-digital converter (ADC) may include a plurality of analog-to-digital converters that receive an input in common, and the plurality of analog-to-digital converters may sample the input at different time points. However, the plurality of ADC in the time-interleaved ADC are affected by an input common-mode voltage.

Figure 1:
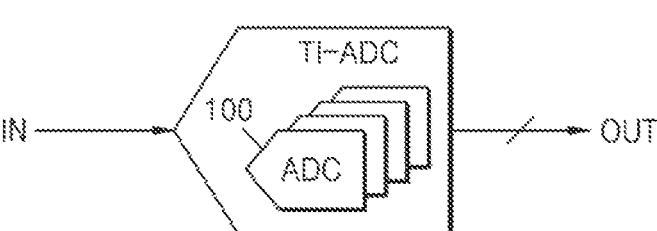
FIG. 1 is a block diagram of an analog-to-digital converter (ADC) according to an embodiment.

FIG. 1 is a block diagram of an analog-to-digital converter (ADC) according to an embodiment.

Referring to FIG. 1, the ADC may be implemented as a time-interleaved analog-to-digital converter (TI-ADC) 10. However, embodiments are not limited thereto, and in some embodiments, the analog-to-digital converter may be implemented as any device that converts analog signals into digital signals.

According to an embodiment, the TI-ADC 10 may generate an output signal OUT, which is a digital signal, by converting an input signal IN, which is an analog signal. In other words, the TI-ADC 10 may receive the input signal IN needing digital conversion and generate the output signal OUT by converting the input signal IN.

As shown in FIG. 1, the TI-ADC 10 may include a plurality of ADCs 100. The plurality of ADCs 100 may commonly (or time-divisionally) receive the input signal IN and may each output a digital signal corresponding to the magnitude of the input signal IN. Each of the plurality of ADCs 100 may be synchronized to a clock signal, and a plurality of clock signals supplied to the ADCs 100 may have different phases from each other. Therefore, the TI-ADC 10 may have a high sampling rate.

Although FIG. 1 shows a single input signal IN, embodiments are not limited thereto. In some embodiments, the TI-ADC 10 may receive two input signals including a first input signal INP and a second input signal INN, wherein the first input signal INP and the second input signal INN may be in the form of a differential signal pair (see, e.g., FIGS. 3A-7F described below).

According to the TI-ADC 10, linearity deterioration due to a leakage current may be reduced by using a sampling circuit that samples without being affected by the leakage current. Detailed descriptions thereof will be given later with reference to the drawings.

Figure 2:
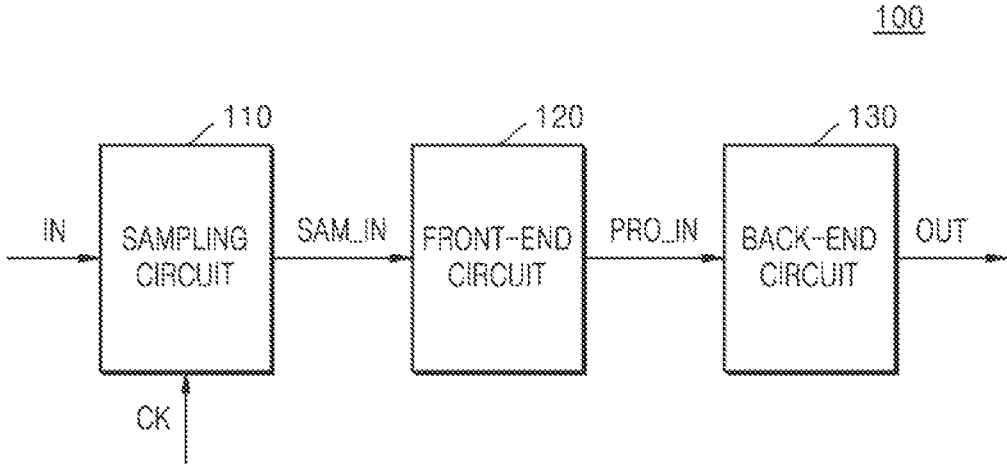
FIG. 2 is a block diagram showing one ADC from among a plurality of ADCs included in a time-interleaved ADC (TI-ADC), according to an embodiment.

FIG. 2 is a block diagram showing one ADC from among a plurality of ADCs included in a TI-ADC, according to an embodiment.

Referring to FIG. 2, the operation of any one ADC 100 from among the plurality of ADCs included in the TI-ADC 10 will be described.

Referring to FIG. 2, the ADC 100 may include a sampling circuit 110, a front-end circuit 120, and a back-end circuit 130.

The sampling circuit 110 may receive the input signal IN, which is an analog signal, and output a sampled signal SAM_IN at regular time intervals. The sampling circuit 110 may provide the sampled signal SAM_IN to the front-end circuit 120.

For example, a clock signal CK may be supplied to the sampling circuit 110, and the input signal IN may be sampled at rising edges of the clock signal CK. The interval between rising edges adjacent to each other (i.e., time t) may become the sampling period of the sampling circuit 110, and the sampling frequency may be 1/t. According to some embodiments, the input signal may be sampled at falling edges of the clock signal CK.

The front-end circuit 120 may receive the sampled signal SAM_IN, process the sampled signal SAM_IN, and output a processed signal PRO_IN. Here, the front-end circuit 120 may include circuits, e.g., an amplifier, a filter, or a mixer, for processing the sampled signal SAM_IN. The front-end circuit 120 may provide the processed signal PRO_IN to the back-end circuit 130.

The back-end circuit 130 may receive the processed signal PRO_IN and output the output signal OUT, which is a digital signal, by converting the processed signal PRO_IN.

Figure 3A:
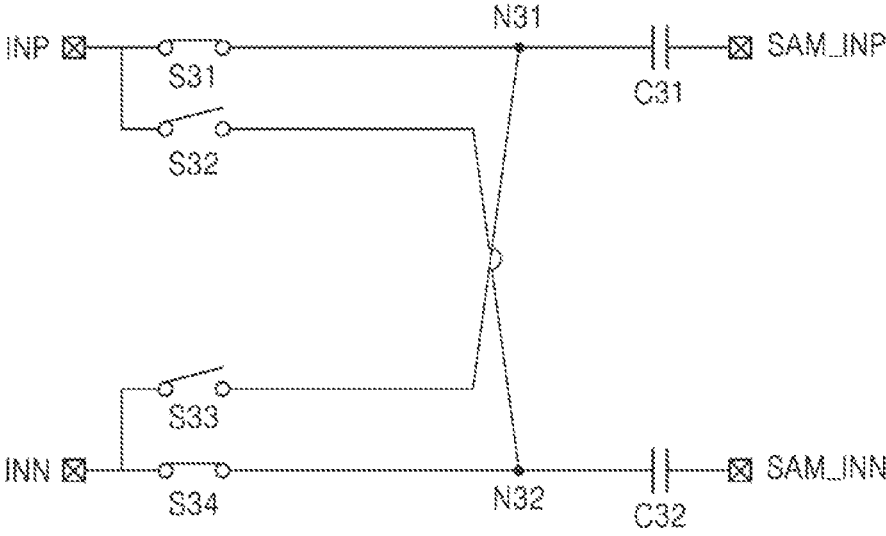
FIG. 3A is a block diagram showing an equivalent circuit of a sampling circuit, according to an embodiment.
Figure 3B:
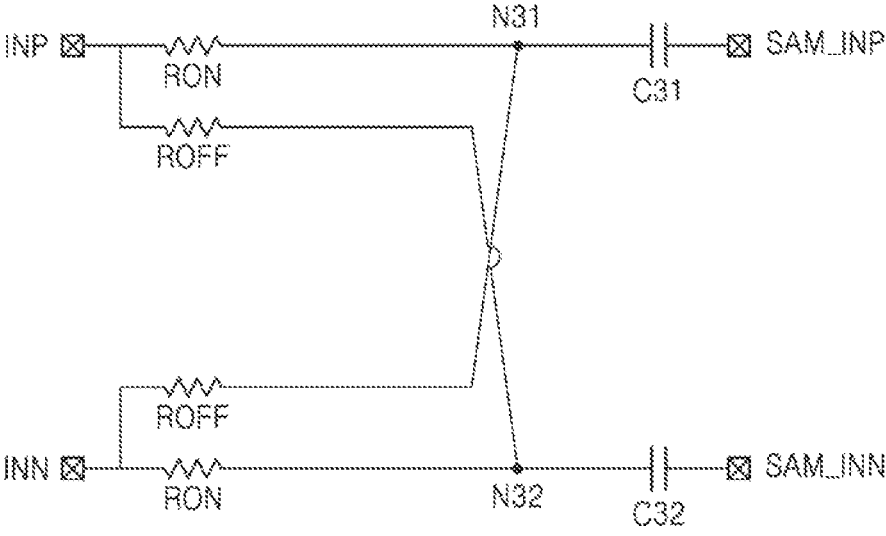
FIG. 3B shows an equivalent circuit of a first phase sampling circuit, according to an embodiment.
Figure 3C:
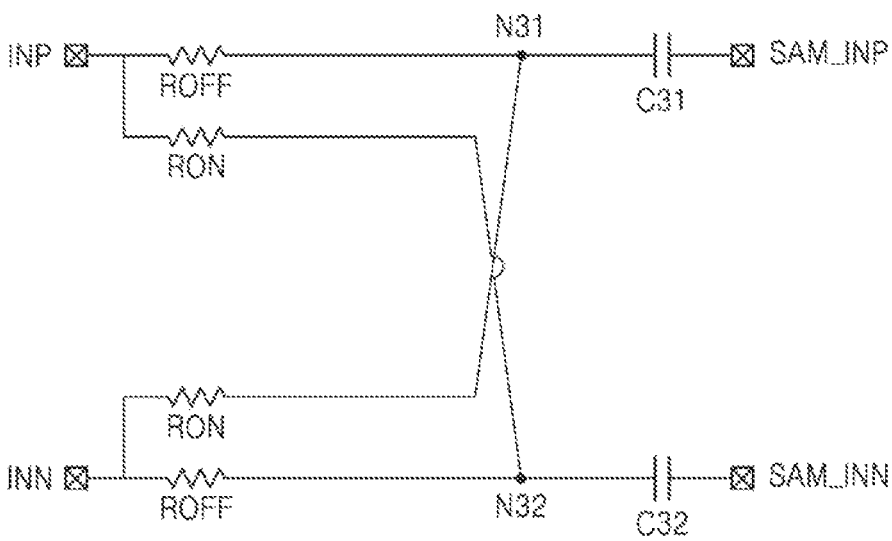
FIG. 3C shows an equivalent circuit of a second phase sampling circuit, according to an embodiment.

FIG. 3A is a block diagram showing an equivalent circuit of a sampling circuit, according to an embodiment. FIG. 3B shows an equivalent circuit of a first phase sampling circuit, according to an embodiment. FIG. 3C shows an equivalent circuit of a second phase sampling circuit, according to an embodiment.

Referring to FIG. 3A, a sampling circuit 110a according to an embodiment will be described first.

The sampling circuit 110a according to an embodiment may receive input signals INP and INN, which are a differential signal pair, as input values and output sampled signals SAM_INP and SAM_INN as output values.

The sampling circuit 110a according to an embodiment may include a plurality of switches, e.g., a first switch S31, a second switch S32, a third switch S33, and a fourth switch S34, and a plurality of capacitors, e.g., a first capacitor C31 and a second capacitor C32.

Referring to FIG. 3A, the first switch S31 may be connected between a terminal for applying the first input signal INP, and a first node N31. The second switch S32 may be connected between the terminal that applies the first input signal INP, and a second node N32. The third switch S33 may be connected between a terminal for applying the second input signal INN, and the first node N31. The fourth switch S34 may be connected between the terminal for applying the second input signal INN, and the second node N32. The first capacitor C31 may be connected between a terminal for outputting a first sampled signal SAM_INP, and the first node N31. The second capacitor C32 may be connected between a terminal for outputting a second sampled signal SAM_INN, and the second node N32.

In some embodiments, the first switch S31 and the fourth switch S34 may be turned on or turned off at the same timing according to a clock signal. In some embodiments, the second switch S32 and the third switch S33 may be turned on or turned off at the same timing according to a clock signal.

In some embodiments, the first switch S31 and the fourth switch S34 may be turned on or turned off complementarily with respect to the second switch S32 and the third switch S33 based on a clock signal. For example, when the first switch S31 and the fourth switch S34 are turned on, the second switch S32 and the third switch S33 may be turned off. Conversely, when the first switch S31 and the fourth switch S34 are turned off, the second switch S32 and the third switch S33 may be turned on.

Hereinafter, a case in which the first switch S31 and the fourth switch S34 are turned on and the second switch S32 and the third switch S33 are turned off will be referred to as a first phase, and a case in which the first switch S31 and the fourth switch S34 are turned off and the second switch S32 and the third switch S33 are turned on will be referred to as a second phase for convenience of description.

The first to fourth switches S31 to S34 may have an on-resistance when turned on and have an off-resistance when turned off. For example, each switch may be implemented with a transistor, where the on-resistance refers to a resistance value between a drain terminal and a source terminal when the transistor is turned on, and the off-resistance refers to a resistance value between the drain terminal and the source terminal when the transistor is turned off.

The description will be given under an assumption that the first to fourth switches S31 to S34 all have the same on-resistance RON and the same off-resistance ROFF.

FIG. 3B is an equivalent circuit diagram showing the sampling circuit 110a of the first phase by using the on-resistance and the off-resistance of switches. FIG. 3C is an equivalent circuit diagram showing the sampling circuit 110a of the second phase by using the on-resistance and the off-resistance of switches.

Referring to FIG. 3B, the level of a voltage applied to the first node N31 of the first phase is $$\frac{ROFF}{RON+ROFF}(INP-INN), \tag{V}$$

and the level of a voltage applied to the second node N32 of the first phase is $$\frac{ROFF}{RON+ROFF}(INN-INP). \tag{V}$$

Here, INP denotes the voltage level of the first input signal INP, and INN denotes the voltage level of the second input signal INN.

Since ROFF is significantly greater than RON, the level of the voltage applied to the first node N31 of the first phase may be approximated as INP-INN (V), and the level of the voltage applied to the second node N32 of the first phase may be approximated as INN-INP (V).

The first capacitor C31 may output the first sampled signal SAM_INP of the first phase based on the INP-INN (V), which is the level of the voltage applied to the first node N31 of the first phase. The second capacitor C32 may output the second sampled signal SAM_INN of the first phase based on the INN-INP (V), which is the level of the voltage applied to the second node N32 of the first phase. The first sampled signal SAM_INP and the second sampled signal SAM_INN may be a differential signal pair.

Referring to FIG. 3C, the level of a voltage applied to the first node N31 of the second phase may be $$\frac{ROFF}{RON+ROFF}(INN-INP), \tag{V}$$

and the level of a voltage applied to the second node N32 of the second phase may be $$\frac{ROFF}{RON+ROFF}(INP-INN). \tag{V}$$

Here, INP denotes the voltage level of the first input signal INP, and INN denotes the voltage level of the second input signal INN.

Since ROFF is significantly greater than RON, the level of the voltage applied to the first node N31 of the second phase may be approximated as INN-INP (V), and the level of the voltage applied to the second node N32 of the second phase may be approximated as INP-INN (V).

The first capacitor C31 may output the first sampled signal SAM_INP of the second phase based on the level of the voltage applied to the first node N31 of the second phase. The first capacitor C31 may output the second sampled signal SAM_INN of the second phase based on the level of the voltage applied to the first node N31 of the second phase. The first sampled signal SAM_INP and the second sampled signal SAM_INN may be a differential signal pair.

In other words, when ROFF is significantly greater than RON, the sampling circuit 110a may output sampled signals SAM_INP and SAM_INN based on voltages (e.g., INP-INN (V) and INN-INP (V)) applied to the first node N31 and the second node N32, and thus the linearity between the magnitude of an input signal and the magnitude of an output signal may be maintained.

However, due to a high-temperature environment or the need for high-speed implementation, the magnitude of ROFF may be reduced more significantly as compared to RON. In this case, that is, when ROFF is not significantly greater than RON, the sampling circuit 110a needs to output the sampled signals SAM_INP and SAM_INN based on the voltages $$(e.g., \frac{ROFF}{RON+ROFF}(INP-INN) \text{ and} \tag{V}$$

$$\frac{ROFF}{RON+ROFF}(INN-INP)) \tag{V}$$

applied to the first node N31 and the second node N32, and thus the linearity between the magnitude of an input signal and the magnitude of an output signal may be deteriorated.

Figure 4:
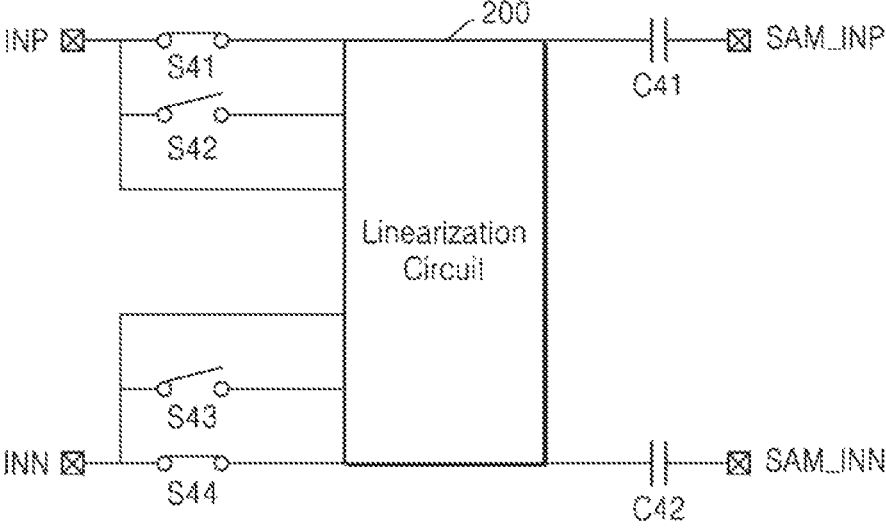
FIG. 4 is a block diagram showing a sampling circuit according to an embodiment.

Even when RON is reduced due to a high-temperature environment or the need for high-speed design, the sampling circuit 110 according to an embodiment may maintain the linearity between the magnitude of an input signal and the magnitude of an output signal by using a linearization circuit (linearization circuit 200 of FIG. 4). Hereinafter, a sampling circuit 110b including a linearization circuit (the linearization circuit 200 of FIG. 4) will be described.

FIG. 4 is a block diagram showing a sampling circuit according to an embodiment.

The sampling circuit 110b according to an embodiment may receive input signals INP and INN, which are a differential signal pair, as input values and output sampled signals SAM_INP and SAM_INN as output values.

The sampling circuit 110b according to an embodiment may further include the linearization circuit 200. In other words, the sampling circuit 110b according to an embodiment may include a plurality of switches, e.g., a first switch S41, a second switch S42, a third switch S43, and a fourth switch S44, a plurality of capacitors, e.g., a first capacitor C41 and a second capacitor C42, and the linearization circuit 200.

Referring to FIG. 4, the first switch S41 may be connected between a terminal for applying the first input signal INP, and the linearization circuit 200. The second switch S42 may be connected between the terminal that applies the first input signal INP, and the linearization circuit 200. The third switch S43 may be connected between a terminal for applying the second input signal INN, and the linearization circuit 200. The fourth switch S44 may be connected between the terminal for applying the second input signal INN, and the linearization circuit 200. The linearization circuit 200 may be connected to the terminal for applying the first input signal INP and the terminal for applying the second input signal INN. The first capacitor C41 may be connected between a terminal for outputting the first sampled signal SAM_INP, and the linearization circuit 200. The second capacitor C42 may be connected between a terminal for outputting the second sampled signal SAM_INN, and the linearization circuit 200.

Since the linearization circuit 200 is connected to the terminal for applying the first input signal INP and the terminal for applying the second input signal INN, linearity deterioration due to a leakage current may be reduced. Detailed descriptions thereof will be given later with reference to the drawings below.

Figure 5:
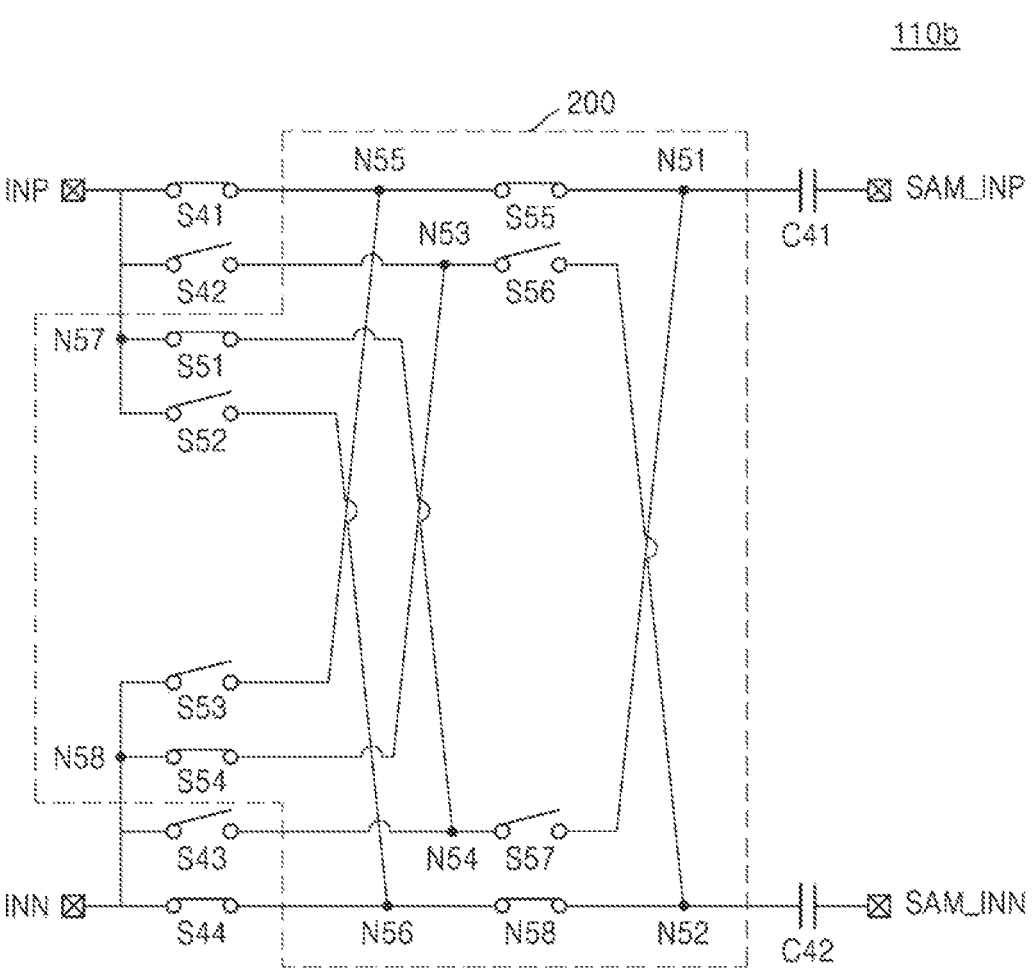
FIG. 5 is an equivalent circuit diagram of a sampling circuit including a linearization circuit, according to an embodiment.

FIG. 5 is an equivalent circuit diagram of a sampling circuit including a linearization circuit, according to an embodiment.

FIG. 5 is a diagram showing the sampling circuit 110b according to an embodiment of the linearization circuit 200 of FIG. 4 and includes an equivalent circuit of the linearization circuit 200.

The sampling circuit 110b may include the first to fourth switches S41 to S44, the first and second capacitors C41 and C42, and the linearization circuit 200. The linearization circuit 200 may include a fifth switch S51, a sixth switch S52, a seventh switch S53, an eighth switch S54, a ninth switch S55, a tenth switch S56, an eleventh switch S57, and a twelfth switch S58.

Referring to FIG. 5, a terminal for inputting the first input signal INP may be connected to a seventh node N57. A terminal for inputting the second input signal INN may be connected to an eighth node N58.

The first switch S41 may be connected between the seventh node N57 and a fifth node N55. The second switch S42 may be connected between the seventh node N57 and a third node N53. The third switch S43 may be connected between the eighth node N58 and a fourth node N54. The fourth switch S44 may be connected between the eighth node N58 and a sixth node N56. The fifth switch S51 may be connected between the seventh node N57 and the fourth node N54. The sixth switch S52 may be connected between the seventh node N57 and the sixth node N56. The seventh switch S53 may be connected between the eighth node N58 and the fifth node N55. The eighth switch S54 may be connected between the eighth node N58 and the third node N53. The ninth switch S55 may be connected between the fifth node N55 and a first node N51. The tenth switch S56 may be connected between the third node N53 and a second node N52. The eleventh switch S57 may be connected between the fourth node N54 and the first node N51. The twelfth switch S58 may be connected between the sixth node N56 and the second node N52.

The first capacitor C41 may be connected between the first node N51 and a terminal for outputting the first sampled signal SAM_INP. The second capacitor C42 may be connected between the second node N52 and a terminal for outputting the second sampled signal SAM_INN.

In some embodiments, the first switch S41, the fourth switch S44, the fifth switch S51, the eighth switch S54, the ninth switch S55, and the twelfth switch S58 may be turned on or turned off at the same timing according to a clock signal. In some embodiments, the second switch S42, the third switch S43, the sixth switch S52, the seventh switch S53, the tenth switch S56, and the eleventh switch S57 may be turned on or turned off at the same timing according to a clock signal.

In some embodiments, the first switch S41, the fourth switch S44, the fifth switch S51, the eighth switch S54, the ninth switch S55, and the twelfth switch S58 may be turned on or turned off complementarily with respect to the second switch S42, the third switch S43, the sixth switch S52, the seventh switch S53, the tenth switch S56, and the eleventh switch S57, based on a clock signal. For example, when the first switch S41, the fourth switch S44, the fifth switch S51, the eighth switch S54, the ninth switch S55, and the twelfth switch S58 are turned on, the second switch S42, the third switch S43, the sixth switch S52, the seventh switch S53, the tenth switch S56, and the eleventh switch S57 may be turned off. Conversely, when the first switch S41, the fourth switch S44, the fifth switch S51, the eighth switch S54, the ninth switch S55, and the twelfth switch S58 are turned off, the second switch S42, the third switch S43, the sixth switch S52, the seventh switch S53, the tenth switch S56, and the eleventh switch S57 may be turned on.

Hereinafter, a case in which the first switch S41, the fourth switch S44, the fifth switch S51, the eighth switch S54, the ninth switch S55, and the twelfth switch S58 are turned on and the second switch S42, the third switch S43, the sixth switch S52, the seventh switch S53, the tenth switch S56, and the eleventh switch S57 are turned off will be referred to as a first phase, whereas a case in which the first switch S41, the fourth switch S44, the fifth switch S51, the eighth switch S54, the ninth switch S55, and the twelfth switch S58 are turned off and the second switch S42, the third switch S43, the sixth switch S52, the seventh switch S53, the tenth switch S56, and the eleventh switch S57 are turned on will be referred to as a second phase. For example, FIG. 5 may be an equivalent circuit diagram of the sampling circuit 110b that performs the first phase of the sampling operation.

In some embodiments, the first to fourth switches S41 to S44 and the fifth to twelfth switches S51 to S58 may have an on-resistance when turned on and an off-resistance when turned off. For example, each switch may be implemented with a transistor, where the on-resistance refers to a resistance value between a drain terminal and a source terminal when the transistor is turned on, and the off-resistance refers to a resistance value between the drain terminal and the source terminal when the transistor is turned off.

The description will be given under an assumption that the first to fourth switches S41 to S44 and the fifth to twelfth switches S51 to S58 all have the same on-resistance.

Figure 6A:
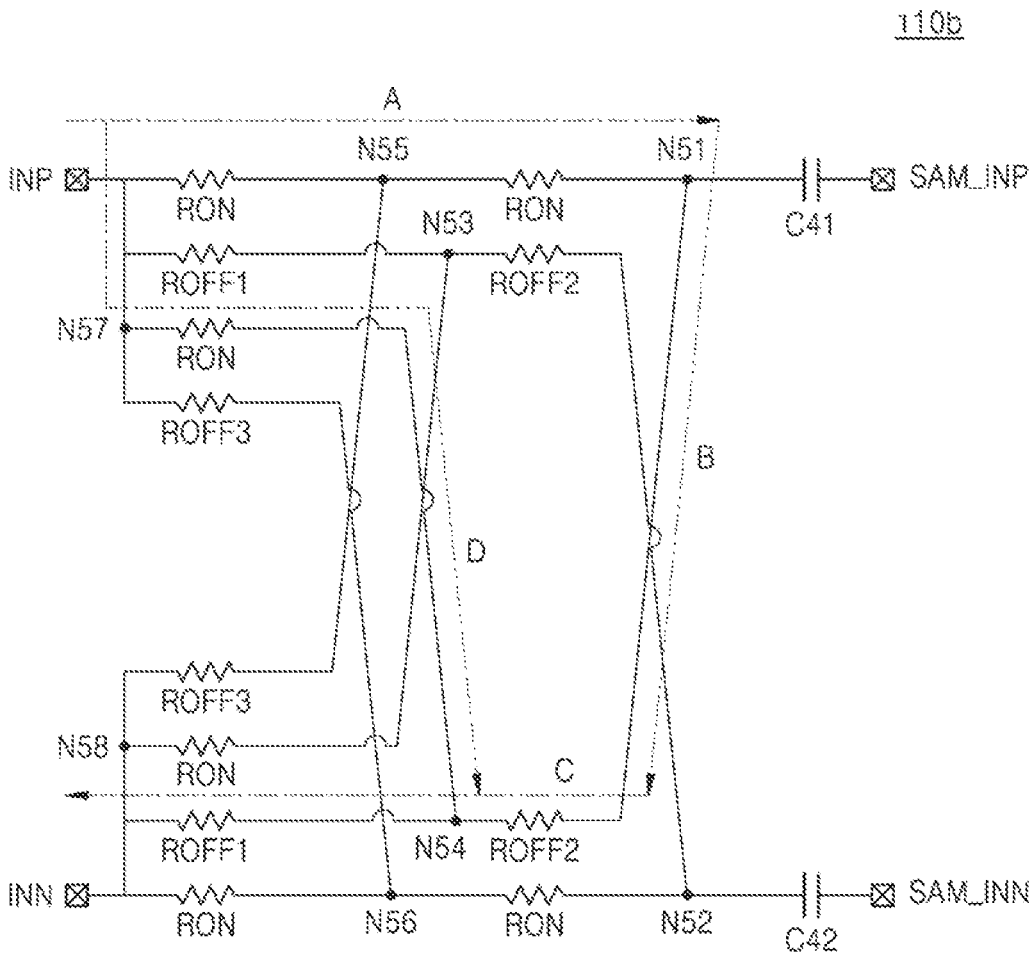
FIG. 6A shows an equivalent circuit of a first phase sampling circuit, according to an embodiment.
Figure 6B:
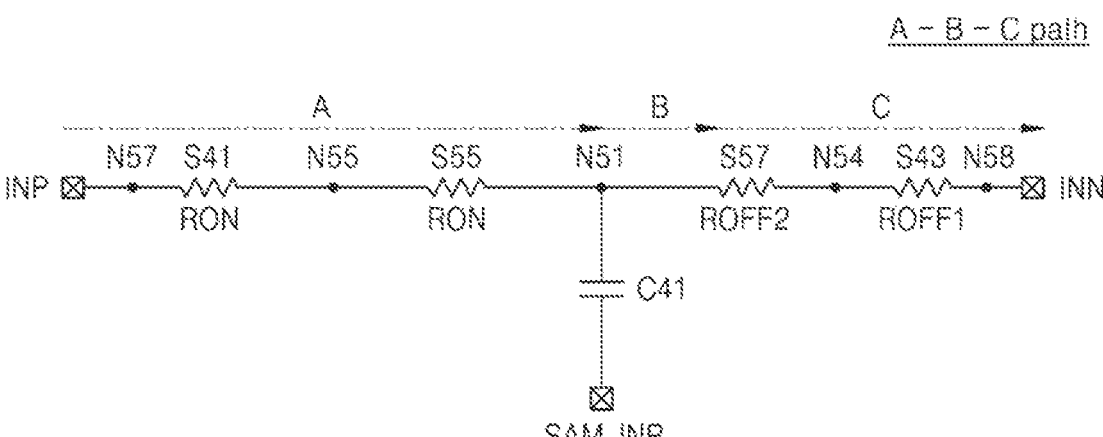
FIG. 6B is a diagram for describing an equivalent circuit of a first phase sampling circuit, according to an embodiment.
Figure 6C:
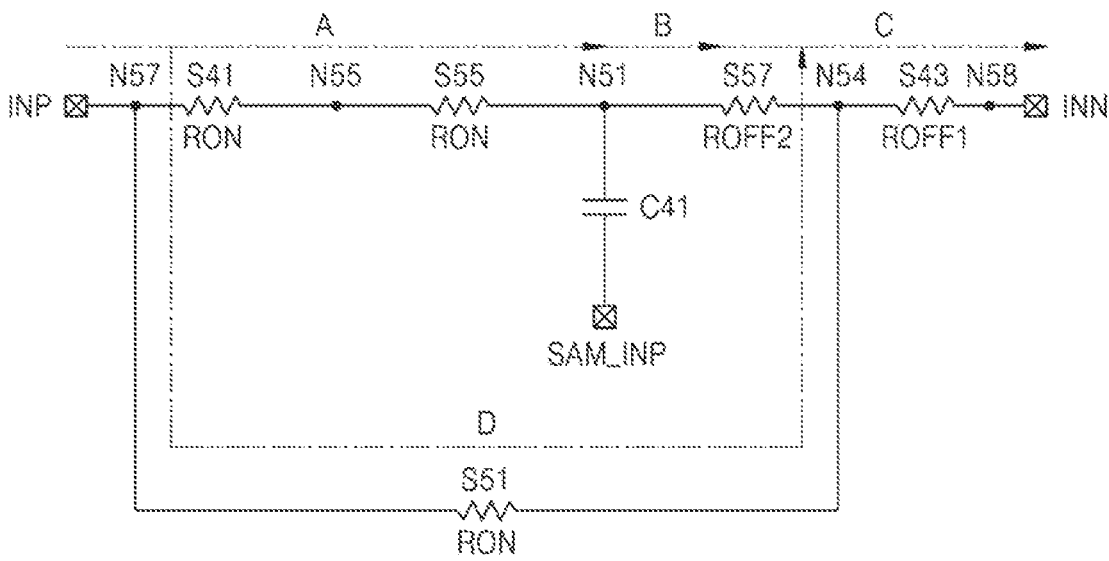
FIG. 6C is a diagram for describing an equivalent circuit of a first phase sampling circuit, according to an embodiment.
Figure 6D:
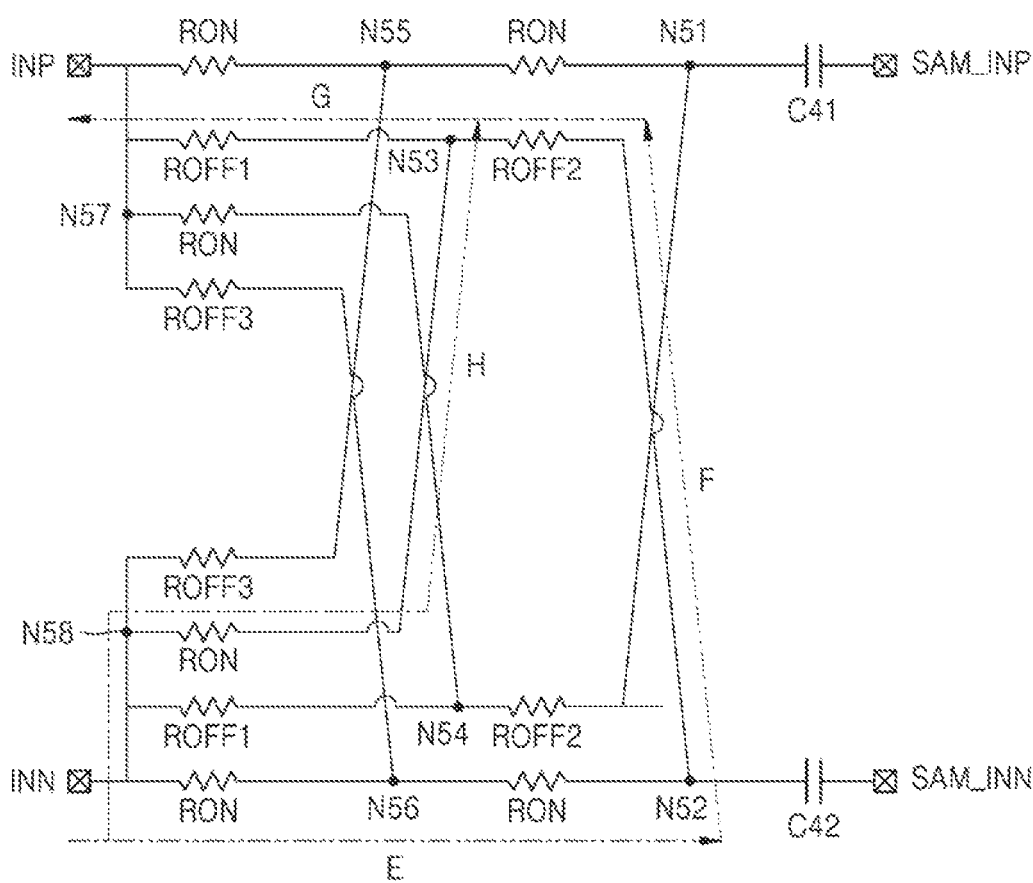
FIG. 6D is a diagram for describing an equivalent circuit of a first phase sampling circuit, according to an embodiment.
Figure 6E:
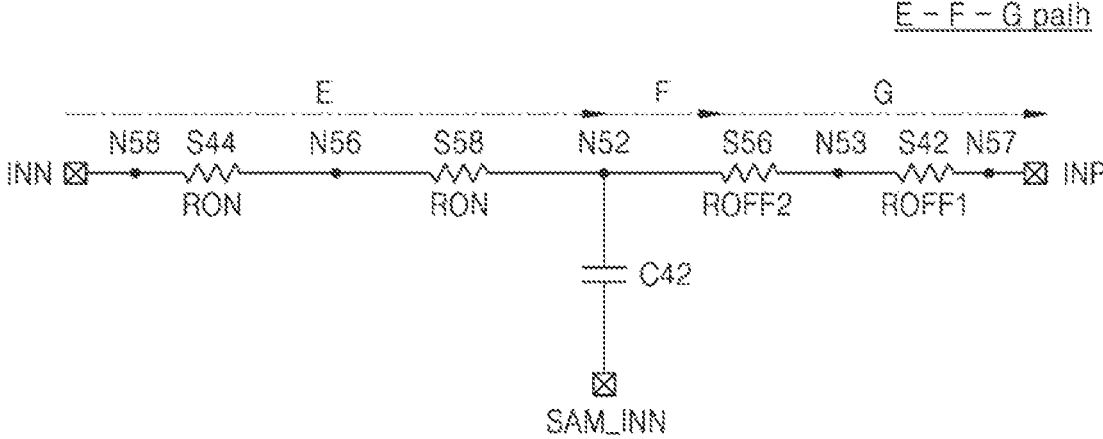
FIG. 6E is a diagram for describing an equivalent circuit of a first phase sampling circuit, according to an embodiment.
Figure 6F:
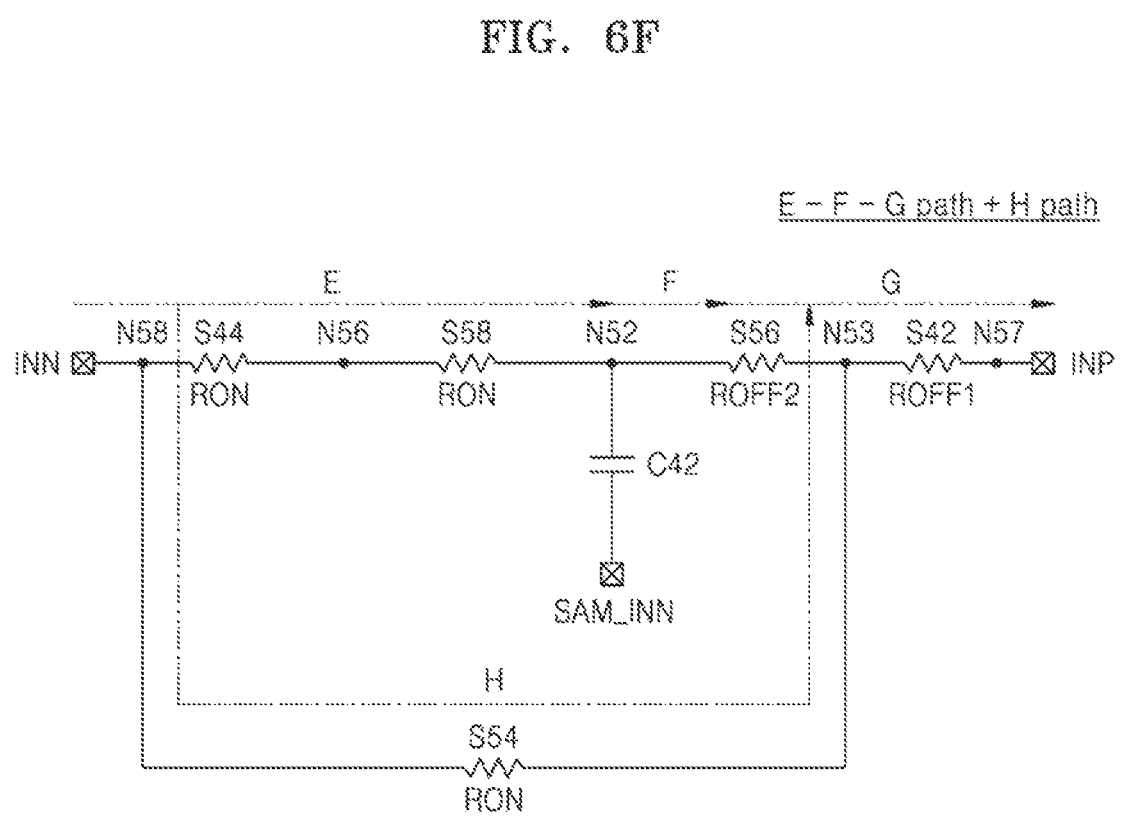

FIG. 6A shows an equivalent circuit of a first phase sampling circuit, according to an embodiment. FIG. 6B is a diagram for describing an equivalent circuit of a first phase sampling circuit, according to an embodiment. FIG. 6C is a diagram for describing an equivalent circuit of a first phase sampling circuit, according to an embodiment. FIG. 6C shows an equivalent circuit of a first phase sampling circuit, according to an embodiment. FIG. 6D is a diagram for describing an equivalent circuit of a first phase sampling circuit, according to an embodiment. FIG. 6E is a diagram for describing an equivalent circuit of a first phase sampling circuit, according to an embodiment. FIG. 6F is a diagram for describing an equivalent circuit of a first phase sampling circuit, according to an embodiment.

FIG. 6A is an equivalent circuit diagram showing the sampling circuit 110b of the first phase by using the on-resistance and the off-resistance of switches. In the first phase, the first switch S41, the fourth switch S44, the fifth switch S51, the eighth switch S54, the ninth switch S55, and the twelfth switch S58 may be turned on, the second switch S42, the third switch S43, the sixth switch S52, the seventh switch S53, the tenth switch S56, and the eleventh switch S57 may be turned off.

The first to fourth switches S41 to S44 and the fifth to twelfth switches S51 to S58 may have the same on-resistance RON. The second switch S42 and the third switch S43 may have a first off-resistance ROFF1, the tenth switch S56 and the eleventh switch S57 may have a second off-resistance ROFF2, and the sixth switch S52 and the seventh switch S53 may have a third off-resistance ROFF3.

The first capacitor C41 may output the first sampled signal SAM_INP of the first phase based on the level of the voltage applied to the first node N51 of the first phase. The second capacitor C42 may output the second sampled signal SAM_INN of the first phase based on the level of the voltage applied to the second node N52 of the first phase.

According to some embodiments, in the first phase, by making the level of the voltage applied to the first node N51 and the level of the voltage applied to the fourth node N54 identical to each other, the linearity between the magnitude of the voltage of the input signals INP and INN and magnitude of the voltage of the first sampled signal SAM_INP, which is an output signal, may be improved. According to some embodiments, in the first phase, by making the level of the voltage applied to the third node N53 and the level of the voltage applied to the second node N52 identical to each other, the linearity between the magnitude of the voltage of the input signals INP and INN and magnitude of the voltage of the second sampled signal SAM_INN, which is an output signal, may be improved.

The first node N51 will be described in detail with reference to FIGS. 6A, 6B, and 6C, and the second node N52 will be described in detail with reference to FIGS. 6D, 6E, and 6F.

Referring to FIG. 6A, paths related to the level of the voltage applied to the first node N51 and the level of the voltage applied to the fourth node N54 are a path A-B-C interconnecting a terminal for applying the first input signal INP, the seventh node N57, the fifth node N55, the first node N51, the fourth node N54, the eighth node N58, and a terminal for applying the second input signal INN and a path D interconnecting the seventh node N57 and the fourth node N54.

First, referring to FIG. 6B, the path A-B-C will be described.

Referring to FIG. 6B, the path A-B-C may include a path A interconnecting the terminal for applying the first input signal INP, the seventh node N57, the first switch S41 having the on-resistance RON, the fifth node N55, the ninth switch S55 having the on-resistance RON, and the first node N51;

a path B interconnecting the first node N51 and the eleventh switch S57 having the second off-resistance ROFF2; and a path C interconnecting the eleventh switch S57 having the second off-resistance ROFF2, the fourth node N54, the third switch S43 having the first off-resistance ROFF1, and the terminal for applying the second input signal INN.

When the path D is not considered, the level of a voltage applied to the first node N51 may be $$\frac{ROFF2 + ROFF1}{2RON + ROFF1 + ROFF2}(INP - INN). \tag{V}$$

Here, INP denotes the voltage level of the first input signal INP, INN denotes the voltage level of the second input signal INN, ROFF2 denotes the off-resistance value of the eleventh switch S57, ROFF1 denotes the off-resistance value of the third switch S43, and RON denotes the on-resistance value of the first switch S41 and the ninth switch S55.

In other words, the first capacitor C41 may output the first sampled signal SAM_INP of the first phase based on the $$\frac{ROFF2 + ROFF1}{2RON + ROFF1 + ROFF2}(INP - INN), \tag{V}$$

which is the level of the voltage applied to the first node N51 of the first phase.

Referring to FIG. 6C, the path A-B-C and the path D are shown. The path D may be a path interconnecting the terminal for applying the first input signal INP, the seventh node N57, the fifth switch S51 having the on-resistance RON, and the fourth node N54.

Since ROFF2 is significantly greater than RON, the fifth switch S51 having the on-resistance RON may serve as a short switch to equalize the level of voltages applied to both ends of the eleventh switch S57. In other words, as the level of voltages applied to the both ends of the eleventh switch S57 become identical to each other, the second off-resistance ROFF2, which is the off-resistance of the eleventh switch S57, may become very large.

As the second off-resistance ROFF2 of the eleventh switch S57 becomes very large, $$\frac{ROFF2 + ROFF1}{2RON + ROFF1 + ROFF2}(INP - INN), \tag{V}$$

which is the level of the voltage applied to the first node N51 of the first phase, may be approximated as INP-INN (V).

In other words, the path D is a new leakage path of a leakage current, and, even when the on-resistance RON of switches becomes small, the second off-resistance ROFF2 of the eleventh switch S57 may become very large due to the fifth switch S51, which is a short switch.

Therefore, the first capacitor C41 may output the first sampled signal SAM_INP of the first phase based on INP-INN (V), which is the level of the voltage applied to the first node N51 of the first phase, regardless the on-resistance RON of switches.

Referring to FIG. 6D, paths related to the level of the voltage applied to the second node N52 and the level of the voltage applied to the third node N53 are a path E-F-G interconnecting the eighth node N58, the sixth node N56, the second node N52, the third node N53, and the seventh node N57 and a path H interconnecting the eighth node N58 and the third node N53.

First, referring to FIG. 6E, the path E-F-G will be described.

Referring to FIG. 6E, the path E-F-G may include a path E interconnecting the terminal for applying the second input signal INN, the eighth node N58, the fourth switch S44 having the on-resistance RON, the sixth node N56, the twelfth switch S58 having the on-resistance RON, and the second node N52, a path F interconnecting the second node N52 and the tenth switch S56 having the second off-resistance ROFF2, and a path G interconnecting the tenth switch S56 having the second off-resistance ROFF2, the third node N53, the second switch S42 having the first off-resistance ROFF1, and the terminal for applying the first input signal INP.

When the path H is not considered, the level of a voltage applied to the second node N52 may be $$\frac{ROFF2 + ROFF1}{2RON + ROFF1 + ROFF2}(INN - INP). \tag{V}$$

Here, INP denotes the voltage level of the first input signal INP, INN denotes the voltage level of the second input signal INN, ROFF2 denotes the off-resistance value of the tenth switch S56, ROFF1 denotes the off-resistance value of the second switch S42, and RON denotes the on-resistance value of the fourth switch S44 and the twelfth switch S58.

The second capacitor C42 may output the second sampled signal SAM_INN of the first phase based on the $$\frac{ROFF2 + ROFF1}{2RON + ROFF1 + ROFF2}(INN - INP), \tag{V}$$

which is the level of the voltage applied to the second node N52 of the first phase.

Referring to FIG. 6f, the path E-F-G and the path H are shown. The path H may interconnect the terminal for applying the second input signal INN, the eighth node N58, the eighth switch S54 having the on-resistance RON, and the third node N53.

Since ROFF2 is significantly greater than RON, the eighth switch S54 having the on-resistance RON may serve as a short switch to equalize the level of voltages applied to both ends of the tenth switch S56. In other words, as the level of voltages applied to the both ends of the tenth switch S56 become identical to each other, the second off-resistance ROFF2, which is the off-resistance of the tenth switch S56, may become very large.

As the second off-resistance ROFF2 of the tenth switch S56 becomes very large, $$\frac{ROFF2 + ROFF1}{2RON + ROFF1 + ROFF2}(INN - INP). \tag{V}$$

which is the level of the voltage applied to the second node N52 of the first phase, may be approximated as INN-INP (V).

In other words, the path H is a new leakage path of a leakage current, and, even when the on-resistance RON of switches becomes small, the second off-resistance ROFF2 of the tenth switch S56 may become very large due to the eighth switch S54, which is a short switch.

Therefore, the second capacitor C42 may output the second sampled signal SAM_INN of the first phase based on INN-INP (V), which is the level of the voltage applied to the second node N52 of the first phase, regardless the on-resistance RON of switches.

Therefore, in the first phase, the sampling circuit 110 according to an embodiment may maintain the linearity by using the linearization circuit (the linearization circuit 200 of FIG. 4) even when the on-resistance RON of switches has become small due to a high-temperature environment or the need for high-speed design.

Figure 7A:
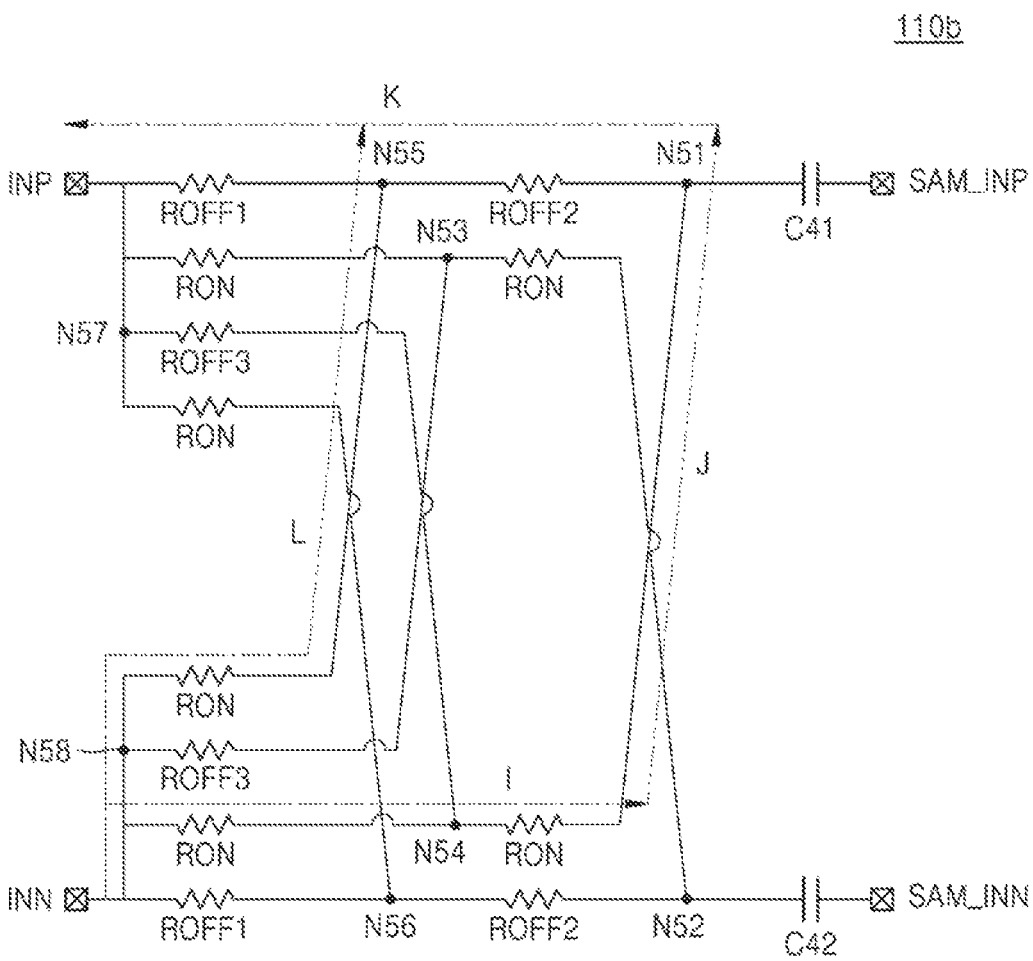
FIG. 7A shows an equivalent circuit of a second phase sampling circuit, according to an embodiment.
Figure 7B:
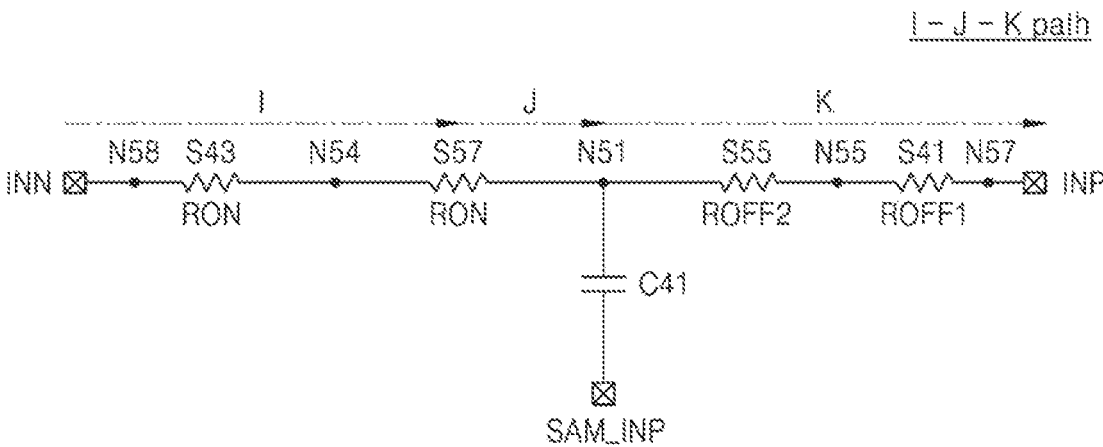
FIG. 7B is a diagram for describing an equivalent circuit of a second phase sampling circuit, according to an embodiment.
Figure 7C:
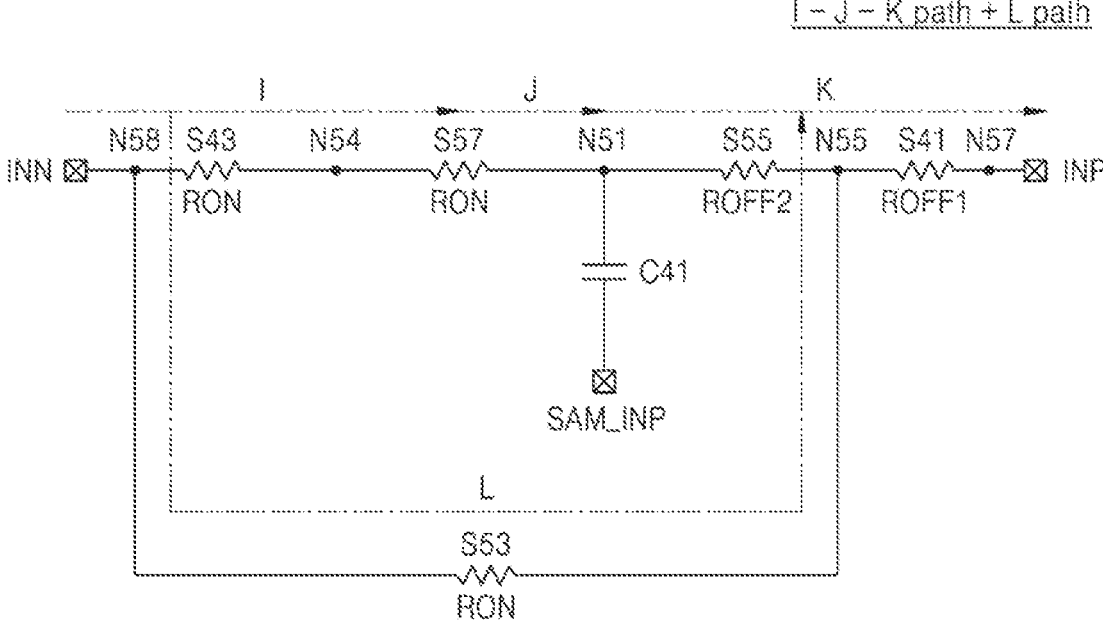
FIG. 7C is a diagram for describing an equivalent circuit of a second phase sampling circuit, according to an embodiment.
Figure 7D:
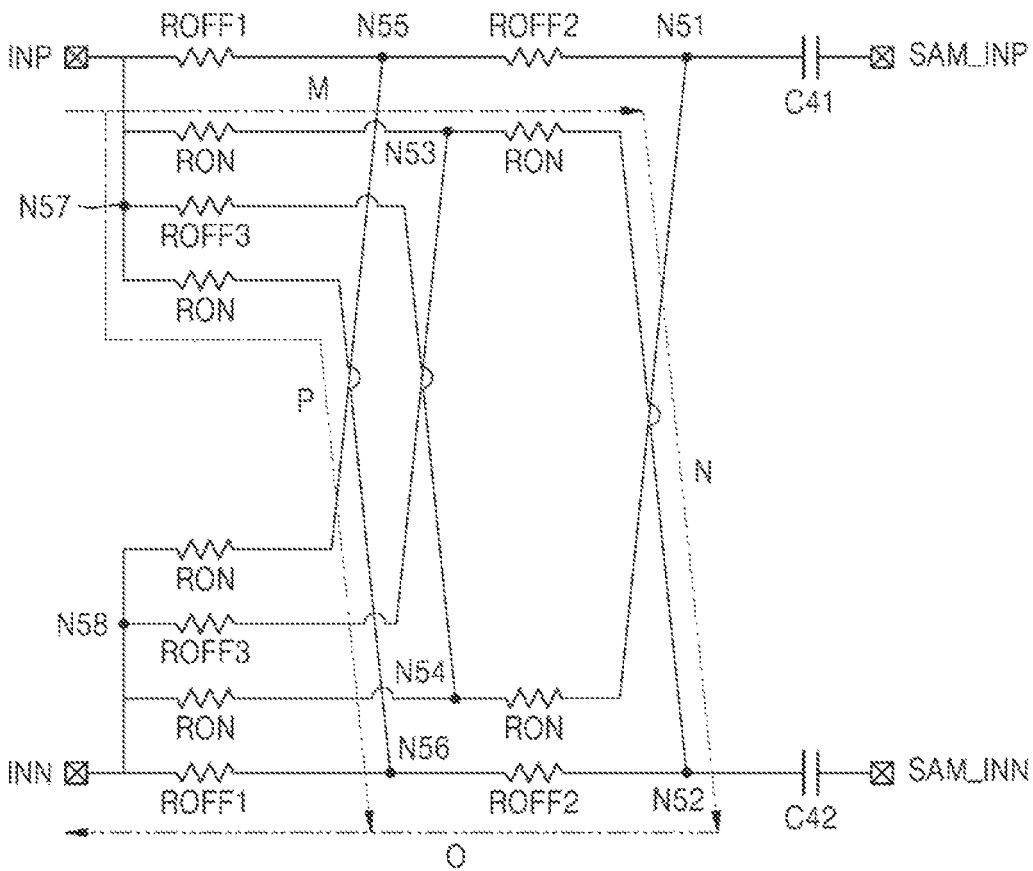
FIG. 7D shows an equivalent circuit of a second phase sampling circuit, according to an embodiment.
Figure 7E:
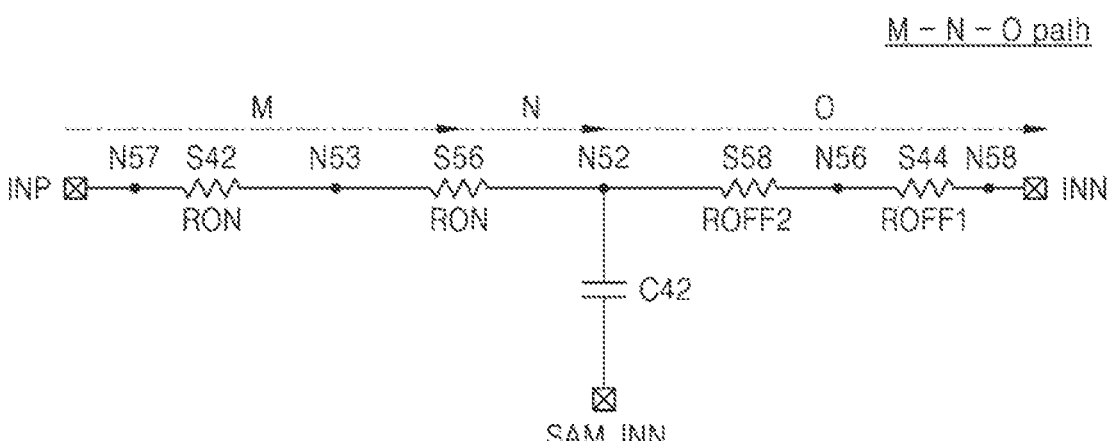
FIG. 7E is a diagram for describing an equivalent circuit of a second phase sampling circuit, according to an embodiment.
Figure 7F:
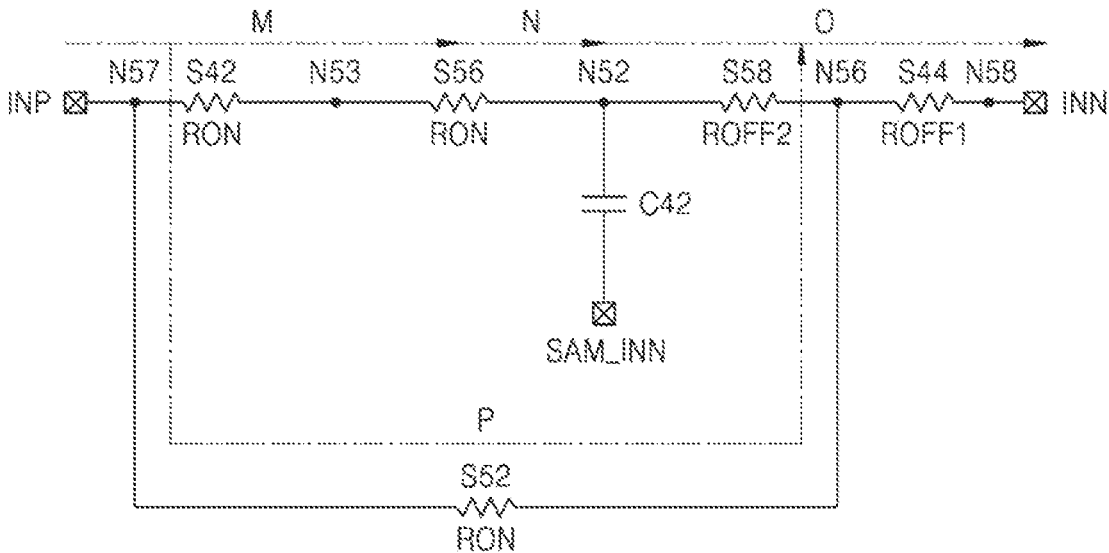
FIG. 7F is a diagram for describing an equivalent circuit of a second phase sampling circuit, according to an embodiment.

FIG. 7A shows an equivalent circuit of a second phase sampling circuit, according to an embodiment. FIG. 7B is a diagram for describing an equivalent circuit of a second phase sampling circuit, according to an embodiment. FIG. 7C is a diagram for describing an equivalent circuit of a second phase sampling circuit, according to an embodiment. FIG. 7D shows an equivalent circuit of a second phase sampling circuit, according to an embodiment. FIG. 7E is a diagram for describing an equivalent circuit of a second phase sampling circuit, according to an embodiment. FIG. 7F is a diagram for describing an equivalent circuit of a second phase sampling circuit, according to an embodiment.

FIG. 7A is an equivalent circuit diagram showing the sampling circuit 110b of the second phase by using the on-resistance and the off-resistance of switches. In the second phase, the first switch S41, the fourth switch S44, the fifth switch S51, the eighth switch S54, the ninth switch S55, and the twelfth switch S58 may be turned off, the second switch S42, the third switch S43, the sixth switch S52, the seventh switch S53, the tenth switch S56, and the eleventh switch S57 may be turned on.

The switches S41 to S44 and S51 to S58 may have the same on-resistance RON, the first switch S41 and the fourth switch S44 may have the first off-resistance ROFF1, the ninth switch S55 and the twelfth switch S58 may have the second off-resistance ROFF2, and the fifth switch S51 and the eighth switch S54 may have the third off-resistance ROFF3.

In the second phase, the first capacitor C41 may output the first sampled signal SAM_INP based on the level of the voltage applied to the first node N51. In the second phase, the second capacitor C42 may output the second sampled signal SAM_INN of the second phase based on the level of the voltage applied to the second node N52.

According to some embodiments, in the second phase, by making the level of the voltage applied to the first node N51 and the level of the voltage applied to the fifth node N55 identical to each other, the linearity between the magnitude of the voltage of the input signals INP and INN and magnitude of the voltage of the first sampled signal SAM_INP, which is an output signal, may be improved. According to some embodiments, by making the level of the voltage applied to the second node N52 and the level of the voltage applied to the sixth node N56 identical to each other, the linearity between the magnitude of the voltage of the input signals INP and INN and magnitude of the voltage of the second sampled signal SAM_INN, which is an output signal, may be improved.

The first node N51 will be described in detail with reference to FIGS. 7A, 7B, and 7C, and the second node N52 will be described in detail with reference to FIGS. 7D, 7E, and 7F.

Referring to FIG. 7A, paths related to the level of the voltage applied to the first node N51 and the level of the voltage applied to the fifth node N55 are a path I-J-K interconnecting the terminal for applying the second input signal INN, the eighth node N58, the fourth node N54, the first node N51, the fifth node N55, the eighth node N58, and the terminal for applying the first input signal INP and a path L interconnecting the eighth node N58 and the fifth node N55.

First, referring to FIG. 7B, the path I-J-K will be described.

Referring to FIG. 7B, the path I-J-K may include a path I interconnecting the terminal for applying the second input signal INN, the eighth node N58, the third switch S43 having the on-resistance RON, the fourth node N54, the eleventh switch S57 having the on-resistance RON, and the first node N51, a path J interconnecting the first node N51 and the ninth switch S55 having the second off-resistance ROFF2, and a path K interconnecting the ninth switch S55 having the second off-resistance ROFF2, the fifth node N55, the first switch S41 having the first off-resistance ROFF1, and the terminal for applying the first input signal INP.

When the path L is not considered, the level of a voltage applied to the first node node N51 may be $$\frac{ROFF2 + ROFF1}{2RON + ROFF1 + ROFF2}(INN - INP). \quad \text{(V)}$$

Here, INP denotes the voltage level of the first input signal INP, INN denotes the voltage level of the second input signal INN, ROFF2 denotes the off-resistance value of the ninth switch S55, ROFF1 denotes the off-resistance value of the first switch S41, and RON denotes the on-resistance value of the third switch S43 and the eleventh switch S57.

In other words, the first capacitor C41 may output the first sampled signal SAM_INP of the second phase based on the $$\frac{ROFF2 + ROFF1}{2RON + ROFF1 + ROFF2}(INN - INP), \quad \text{(V)}$$

which is the level of the voltage applied to the first node N51 of the second phase.

Referring to FIG. 7C, the path I-J-K and the path L are shown. The path L may interconnect the terminal for applying the second input signal INN, the eighth node N58, the seventh switch S53 having the on-resistance RON, and the fifth node N55.

Since ROFF2 is significantly greater than RON, the seventh switch S53 having the on-resistance RON may serve as a short switch to equalize the level of voltages applied to both ends of the ninth switch S55. In other words, as the level of voltages applied to the both ends of the ninth switch S55 become identical to each other, the second off-resistance ROFF2, which is the off-resistance of the ninth switch S55, may become very large.

As the second off-resistance ROFF2 of the ninth switch S55 becomes very large, $$\frac{ROFF2 + ROFF1}{2RON + ROFF1 + ROFF2}(INN - INP), \quad \text{(V)}$$

which is the level of the voltage applied to the first node N51 of the second phase, may be approximated as INN-INP (V).

In other words, the path L is a new leakage path of a leakage current, and, even when the on-resistance RON of switches becomes small, the second off-resistance ROFF2 of the ninth switch S55 may become very large due to the seventh switch S53, which is a short switch.

Therefore, the first capacitor C41 may output the first sampled signal SAM_INP of the second phase based on INN-INP (V), which is the level of the voltage applied to the first node N51 of the second phase, regardless the on-resistance RON of switches.

Referring to FIG. 7D, paths related to the level of the voltage applied to the second node N52 and the level of the voltage applied to the sixth node N56 are a path M-N-O interconnecting the terminal for applying the first input signal INP, the seventh node N57, the third node N53, the second node N52, the sixth node N56, and the eighth node N58 and a path P interconnecting the seventh node N57 and the sixth node N56.

First, referring to FIG. 7E, the path M-N-O will be described.

Referring to FIG. 7E, the path M-N-O may include a path M interconnecting the terminal for applying the first input signal INP, the seventh node N57, the second switch S42 having the on-resistance RON, the third node N53, and the tenth switch S56 having the on-resistance RON, a path N interconnecting the tenth switch S56 having the on-resistance RON and the seventh node N57, and a path O interconnecting the second node N52, the twelfth switch S58 having the second off-resistance ROFF2, the sixth node N56, the fourth switch S44 having the first off-resistance ROFF1, and the terminal for applying the second input signal INN.

When the path O is not considered, the level of a voltage applied to the second node N52 may be $$\frac{ROFF2 + ROFF1}{2RON + ROFF1 + ROFF2}(INP - INN). \quad \text{(V)}$$

Here, INP denotes the voltage level of the first input signal INP, INN denotes the voltage level of the second input signal INN, ROFF2 denotes the off-resistance value of the twelfth switch S58, ROFF1 denotes the off-resistance value of the fourth switch S44, and RON denotes the on-resistance value of the second switch S42 and the tenth switch S56.

The second capacitor C42 may output the second sampled signal SAM_INN of the first phase based on the $$\frac{ROFF2 + ROFF1}{2RON + ROFF1 + ROFF2}(INP - INN), \quad \text{(V)}$$

which is the level of the voltage applied to the second node N52 of the second phase.

Referring to FIG. 7F, the path M-N-O and the path P are shown. The path P may interconnect the terminal for applying the first input signal INP, the seventh node N57, the sixth switch S52 having the on-resistance RON, and the sixth node N56.

Since ROFF2 is significantly greater than RON, the sixth switch S52 having the on-resistance RON may serve as a short switch to equalize the level of voltages applied to both ends of the twelfth switch S58. In other words, as the level of voltages applied to the both ends of the twelfth switch S58 become identical to each other, the second off-resistance ROFF2, which is the off-resistance of the twelfth switch S58, may become very large.

As the second off-resistance ROFF2 of the twelfth switch S58 becomes very large, $$\frac{ROFF2 + ROFF1}{2RON + ROFF1 + ROFF2}(INP - INN), \qquad (V)$$

which is the level of the voltage applied to the second node N52 of the second phase, may be approximated as INP-INN (V).

In other words, the path P is a new leakage path of a leakage current, and, even when the on-resistance RON of switches becomes small, the second off-resistance ROFF2 of the twelfth switch S58 may become very large due to the sixth switch S52, which is a short switch.

Therefore, the second capacitor C42 may output the second sampled signal SAM_INN of the second phase based on INP-INN (V), which is the level of the voltage applied to the second node N52 of the second phase, regardless the on-resistance RON of switches.

Therefore, in the second phase, the sampling circuit 110b according to an embodiment may maintain the linearity by using the linearization circuit (the linearization circuit 200 of FIG. 4) even when the on-resistance RON of switches has become small due to a high-temperature environment or the need for high-speed design.

In the first phase of the sampling circuit 110b according to an embodiment, the fifth switch S51 and the eighth switch S54 may be implemented as short switches, and, in the second phase of the sampling circuit 110b, the seventh switch S53 and the sixth switch S52 may be implemented as short switches.

Therefore, even when the on-resistance RON of switches has become small due to a high-temperature environment or the need for high-speed design, the linearity between the magnitude of an input signal and the magnitude of the output signal in the sampling circuit 110b may be maintained.

Figure 8:
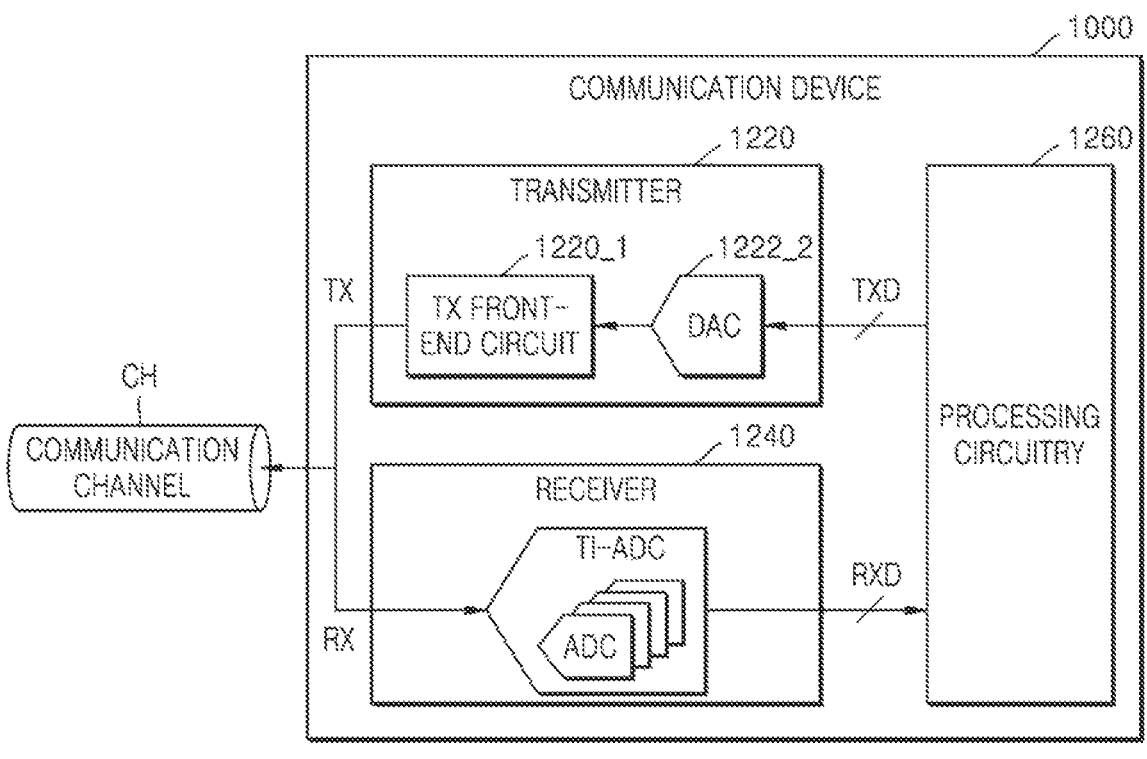
FIG. 8 is a block diagram of a communication device according to an embodiment.

FIG. 8 is a block diagram showing a communication device 1000 according to an embodiment.

According to some embodiments, the TI-ADC 10 described above may be used to process signals received by the communication device 1000.

The communication device 1000 may refer to any device that communicates with another communication device through a communication channel CH. For example, in some embodiments, the communication device 1000 may be a portable device, such as a laptop computer, a mobile phone, and a wearable device, or a component included in the portable device. In some embodiments, the communication device 1000 may be a stationary device, such as a desktop computer, a server, and a kiosk, or a component included in the stationary device. In some embodiments, the communication device 1000 may be used as a component of a means of transportation such as a car or a ship. According to some embodiments, the communication channel CH may include a wired channel, and the communication device 1000 may perform communication by based on any wired communication, e.g., optical communication, Ethernet, peripheral component interconnect (PCI), PCI express (PCIe), universal serial bus (USB), serial ATA (SATA), etc. According to some embodiments, the communication channel CH may include a wireless channel, and the communication device 1000 may perform communication based on any wireless communication, e.g., wireless local area network (WLAN), Bluetooth, long-term evolution (LTE), 5th generation (5G), etc.

As shown in FIG. 8, the communication device 1000 may include a transmitter 1220, a receiver 1240, and processing circuitry 1260. When the communication channel CH includes a wireless channel, the communication device 1000 may further include at least one antenna. The at least one antenna may be connected to the transmitter 1220 and the receiver 1240. According to some embodiments, the transmitter 1220 and the receiver 1240 may be implemented as a single component and may be collectively referred to as a transceiver.

The transmitter 1220 may receive transmission data TXD from the processing circuitry 1260 and output a transmission signal TX to the communication channel CH based on the transmission data TXD. As shown in FIG. 8, the transmitter 1220 may include a transmitting side front-end circuit 1220_1 and a digital-to-analog converter (DAC) 1220_2. The DAC 1220_2 may convert the transmission data TXD received from the processing circuitry 1260 into an analog signal, and the transmitting side front-end circuit 1220_1 may generate the transmission signal TX by processing the analog signal. The transmitting side front-end circuit 1220_1 may include circuits for processing analog signals, such as an amplifier, a filter, or a mixer.

The receiver 1240 may receive a reception signal RX from the communication channel CH and provide reception data RXD to the processing circuitry 1260 based on the reception signal RX. As shown in FIG. 8, the receiver 1240 may include an ADC. The ADC may process the reception signal RX and may include circuits for processing the reception signal RX, e.g., an amplifier, a filter, or a mixer.

The analog-to-digital converter may generate the reception data RXD by converting signals received from the sampling circuit described above. For high-speed communication, in some embodiments, the ADC may be the TI-ADC 10 including a plurality of sub-ADCs. According to some embodiments, the sampling circuit may include switches implemented as short switches, and thus, even when the on-resistance RON of the switches has become small due to a high-temperature environment or the need for high-speed design, the linearity between the magnitude of an output signal and the magnitude of an input signal may be maintained at the sampling circuit.

The processing circuitry 1260 may generate the transmission data TXD based on information to be transmitted to another communication device through the communication channel CH in a transmission mode and provide the transmission data TXD to the transmitter 1220. The processing circuitry 1260 may receive the reception data RXD from the transmitter 1220 in a reception mode and obtain information transmitted by another communication device through the communication channel CH by processing the reception data RXD. The processing circuitry 1260 may include programmable components, components providing fixed functionality, and/or reconfigurable components.

While various embodiments have been particularly shown and described with reference to the drawings, it will be understood that various changes in form and details may be made therein without departing from the spirit and scope of the following claims.

What is claimed is:

1. A sampling circuit comprising:
   a linearization circuit connected to a first input terminal for receiving a first input signal and a second input terminal for receiving a second input signal;
   a first switch connected between the first input terminal and the linearization circuit;

a second switch connected between the first input terminal and the linearization circuit;

a third switch connected between the second input terminal and the linearization circuit;

a fourth switch connected between the second input terminal and the linearization circuit;

a first capacitor connected between the linearization circuit and a first output terminal for outputting a first sampled signal; and a second capacitor connected between the linearization circuit and a second output terminal for outputting a second sampled signal.

2. The sampling circuit of claim 1, wherein the first switch is connected between a seventh node and a fifth node, the second switch is connected between the seventh node and a third node, the third switch is connected between an eighth node and a fourth node, the fourth switch is connected between the eighth node and a sixth node, the first input terminal is connected to the seventh node, the second input terminal is connected to the eighth node, the first capacitor is connected between a first node and the first output terminal, the second capacitor is connected between a second node and the second output terminal, and the linearization circuit comprises:

a fifth switch connected between the seventh node and the fourth node;

a sixth switch connected between the seventh node and the sixth node;

a seventh switch connected between the eighth node and the fifth node;

an eighth switch connected between the eighth node and the third node;

a ninth switch connected between the fifth node and the first node;

a tenth switch connected between the third node and the second node;

an eleventh switch connected between the fourth node and the second node; and a twelfth switch connected between the sixth node and the second node.

3. The sampling circuit of claim 2, wherein the second switch, the third switch, the sixth switch, the seventh switch, the tenth switch, and the eleventh switch are configured to turn off when the first switch, the fourth switch, the fifth switch, the eighth switch, the ninth switch, and the twelfth switch are turned on.

4. The sampling circuit of claim 2, wherein, when the first switch, the fifth switch, and the ninth switch are turned on and the third switch and the eleventh switch are turned off, a level of a voltage at the first node and a level of a voltage at the fourth node are identical to each other.

5. The sampling circuit of claim 2, wherein, when the fourth switch, the twelfth switch, and the eighth switch are turned on and the tenth switch and the second switch are turned off, a level of a voltage at the second node and a level of a voltage at the third node are identical to each other.

6. The sampling circuit of claim 2, wherein the first switch, the fourth switch, the fifth switch, the eighth switch, the ninth switch, and the twelfth switch are configured to turn off when the second switch, the third switch, the sixth switch, the seventh switch, the tenth switch, and the eleventh switch are turned on.

7. The sampling circuit of claim 2, wherein, when the third switch, the seventh switch, and the eleventh switch are turned on and the first switch and the ninth switch are turned off, a level of a voltage at the first node and a level of a voltage at the fifth node are identical to each other.

8. The sampling circuit of claim 2, wherein, when the second switch, the sixth switch, and the tenth switch are turned on and the twelfth switch and the fourth switch are turned off, a level of a voltage at the second node and a level of a voltage at the sixth node are identical to each other.

9. The sampling circuit of claim 2, wherein the first input signal and the second input signal constitute a differential signal pair.

10. An analog-to-digital converter comprising:

a sampling circuit configured to receive an input signal, which is an analog signal, and output a sampled signal at regular time intervals;

a front-end circuit configured to receive the sampled signal, process the sampled signal, and output a processed signal; and a back-end circuit configured to receive the processed signal and convert the processed signal to an output signal, which is a digital signal, and output the digital signal, wherein the input signal comprises a first input signal and a second input signal, and wherein the sampling circuit comprises:

a linearization circuit connected to a first input terminal for receiving the first input signal and a second input terminal for receiving the second input signal;

a first switch connected between the first input terminal and the linearization circuit;

a second switch connected between the first input terminal and the linearization circuit;

a third switch connected between the second input terminal and the linearization circuit;

a fourth switch connected between the second input terminal and the linearization circuit;

a first capacitor connected between the linearization circuit and a first output terminal for outputting a first sampled signal; and a second capacitor connected between the linearization circuit and a second output terminal for outputting a second sampled signal.

11. The analog-to-digital converter of claim 10, wherein:

the first switch is connected between a seventh node and a fifth node, the second switch is connected between the seventh node and a third node, the third switch is connected between an eighth node and a fourth node, the fourth switch is connected between the eighth node and a sixth node, the first input terminal is connected to the seventh node, the second input terminal is connected to the eighth node, the first capacitor is connected between a first node and the first output terminal, the second capacitor is connected between a second node and the second output terminal, and the linearization circuit comprises:

a fifth switch connected between the seventh node and the fourth node;

a sixth switch connected between the seventh node and the sixth node;

a seventh switch connected between the eighth node and the fifth node;

an eighth switch connected between the eighth node and the third node;

a ninth switch connected between the fifth node and the first node;

a tenth switch connected between the third node and the second node;

an eleventh switch connected between the fourth node and the second node; and a twelfth switch connected between the sixth node and the second node.

12. The analog-to-digital converter of claim 11, wherein the second switch, the third switch, the sixth switch, the seventh switch, the tenth switch, and the eleventh switch are configured to turn off when the first switch, the fourth switch, the fifth switch, the eighth switch, the ninth switch, and the twelfth switch are turned on.

13. The analog-to-digital converter of claim 11, wherein, when the first switch, the fifth switch, and the ninth switch are turned on and the third switch and the eleventh switch are turned off, a level of a voltage at the first node and a level of a voltage at the fourth node are identical to each other.

14. The analog-to-digital converter of claim 11, wherein, when the fourth switch, the twelfth switch, and the eighth switch are turned on and the tenth switch and the second switch are turned off, a level of a voltage at the second node and a level of a voltage at the third node are identical to each other.

15. The analog-to-digital converter of claim 11, wherein the first switch, the fourth switch, the fifth switch, the eighth switch, the ninth switch, and the twelfth switch are configured to turn off when the second switch, the third switch, the sixth switch, the seventh switch, the tenth switch, and the eleventh switch are turned on.

16. The analog-to-digital converter of claim 11, wherein, when the third switch, the seventh switch, and the eleventh switch are turned on and the first switch and the ninth switch are turned off, a level of a voltage at the first node and a level of a voltage at the fifth node are identical to each other.

17. The analog-to-digital converter of claim 11, wherein, when the second switch, the sixth switch, and the tenth switch are turned on and the twelfth switch and the fourth switch are turned off, a level of a voltage at the second node and a level of a voltage at the sixth node are identical to each other.

18. The analog-to-digital converter of claim 11, wherein the first input signal and the second input signal constitute a differential signal pair.

19. A receiver comprising a sampling circuit configured to receive an input signal, which is an analog signal, and output a sampled signal at regular time intervals, wherein the sampling circuit comprises:

a linearization circuit connected to a first input terminal for receiving a first input signal and a second input terminal for receiving a second input signal;

a first switch connected between the first input terminal and the linearization circuit;

a second switch connected between the first input terminal and the linearization circuit;

a third switch connected between the second input terminal and the linearization circuit;

a fourth switch connected between the second input terminal and the linearization circuit;

a first capacitor connected between the linearization circuit and a first output terminal for outputting a first sampled signal; and a second capacitor connected between the linearization circuit and a second output terminal for outputting a second sampled signal.

20. The receiver of claim 19, wherein:

the first switch is connected between a seventh node and a fifth node, the second switch is connected between the seventh node and a third node, the third switch is connected between an eighth node and a fourth node, the fourth switch is connected between the eighth node and a sixth node, the first input terminal is connected to the seventh node, the second input terminal is connected to the eighth node, the first capacitor is connected between a first node and the first output terminal, the second capacitor is connected between a second node and the second output terminal, and the linearization circuit comprises:

a fifth switch connected between the seventh node and the fourth node;

a sixth switch connected between the seventh node and the sixth node;

a seventh switch connected between the eighth node and the fifth node;

an eighth switch connected between the eighth node and the third node;

a ninth switch connected between the fifth node and the first node;

a tenth switch connected between the third node and the second node;

an eleventh switch connected between the fourth node and the second node; and a twelfth switch connected between the sixth node and the second node.

* * * * *